(12) United States Patent
Kiyohara

(10) Patent No.: US 7,473,990 B2
(45) Date of Patent: Jan. 6, 2009

(54) SEMICONDUCTOR DEVICE FEATURING ELECTRODE TERMINALS FORMING SUPERIOR HEAT-RADIATION SYSTEM

(75) Inventor: Toshinori Kiyohara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 42 days.

(21) Appl. No.: 11/588,347

(22) Filed: Oct. 27, 2006

(65) Prior Publication Data

US 2007/0096317 A1    May 3, 2007

(30) Foreign Application Priority Data

Oct. 28, 2005    (JP)    ............... 2005-314209

(51) Int. Cl.
*H01L 23/02*    (2006.01)
(52) U.S. Cl. ...................... 257/678; 257/692
(58) Field of Classification Search .............. 257/678, 257/692
See application file for complete search history.

(56) References Cited

U.S. PATENT DOCUMENTS 5,349,235 A * 9/1994 Lee et al. .................... 257/693
6,774,466 B1 * 8/2004 Kajiwara et al. ............ 257/673
6,841,865 B2   1/2005 Standing
7,030,445 B2 * 4/2006 Fukuhara .................... 257/328
2002/0179994 A1  12/2002 Chen et al.

FOREIGN PATENT DOCUMENTS

JP    11-74456    3/1999
JP    2004-349331    12/2004

* cited by examiner

*Primary Examiner*—Roy K Potter
(74) *Attorney, Agent, or Firm*—Young & Thompson

(57) ABSTRACT

In a semiconductor device including a semiconductor chip featuring opposite first and second principal faces, and side faces extending therebetween, a first electrode layer is formed on the first principal face, and a second electrode layer is formed on the second principal face. A first metal electrode terminal is electrically adhered to the first electrode layer so that a part of the first metal electrode terminal protrudes out of one of the side faces, and a second metal electrode terminal is electrically adhered to the second electrode layer so that a part of the second metal electrode terminal protrudes out of the one of the side faces of the semiconductor chip. The parts of the first and second metal electrode terminals have respective soldering faces which are perpendicular to the first and second principal faces, and are coplanar with each other.

11 Claims, 10 Drawing Sheets

SEMICONDUCTOR DEVICE FEATURING ELECTRODE TERMINALS FORMING SUPERIOR HEAT-RADIATION SYSTEM

BACKGROUND OF THE INVENTION

1. Field of the Invention

The present invention relates to a semiconductor device including a semiconductor chip and metal electrode terminals adhered to the semiconductor chip so as to form a heat-radiation system for the semiconductor chip, and a method for assembling such a semiconductor device.

2. Description of the Related Art

For example, in a prior art semiconductor device includes a vertical-type power metal oxide semiconductor field effect transistor (MOSFET) chip and metal electrode terminals adhered to the opposite principal faces of the MOSFET chip, the metal electrode terminals are arranged so as to form a heat-radiation system because the MOSFET chip generates a large amount of heat during the operation thereof, as disclosed in, for example, US2002/0179994 A1, U.S. Pat. No. 6,841,865 B2 and JP-H11-074456 A.

Nevertheless, the prior art semiconductor devices fail in diminishing a mounting area which is occupied by the semiconductor device when being mounted on a circuit board, as discussed in detail hereinafter.

On the other hand, U.S. Pat. No. 7,030,445 B2 discloses another prior art semiconductor device which allows considerably diminishing a mounting area which is occupied by the semiconductor device when being mounted on a circuit board.

SUMMARY OF THE INVENTION

It has now been discovered that the above-mentioned prior art semiconductor device disclosed in U.S. Pat. No. 7,030,445 B2 has a problem to be solved as mentioned hereinbelow.

In particular, in U.S. Pat. No. 7,030,445 B2, although a heat-radiation system is also formed by metal electrode terminals of the semiconductor device, it is inferior to the heat-radiation system as disclosed in US2002/0179994 A1 and U.S. Pat. No. 6,841,865 B2, as discussed in detail hereinafter.

Also, in U.S. Pat. No. 7,030,445 B2, when the semiconductor device is mounted on a circuit board by soldering the respective metal electrode terminals to electrode pads formed on a top surface of the circuit board, solder fillets are liable to cause short circuits, as discussed in detail hereinafter.

In accordance with a first aspect of the present invention, there is provided a semiconductor device including a semiconductor chip featuring first and second principal faces opposite to each other, and side faces extending therebetween. A first electrode layer is formed on the first principal face of the semiconductor chip, and a second electrode layer is formed on the second principal face of the semiconductor chip. A first metal electrode terminal is electrically adhered to the first electrode layer so that a part of the first metal electrode terminal is protruded out of one of the side faces of the semiconductor chip, and a second metal electrode terminal is electrically adhered to the second electrode layer so that a part of the second metal electrode terminal is protruded out of the one of the side faces of the semiconductor chip. The parts of the first and second metal electrode terminals have respective soldering faces which are perpendicular to the first and second principal faces of the semiconductor chip, and which are coplanar with each other.

Preferably, the first and second metal electrode terminals are arranged so that the semiconductor device itself can stand when being placed on a plane so that the soldering faces are in contact with the plane.

Each of the first and second electrode terminals may be provided with a finned heat-radiator adhered to an outer face of the corresponding electrode terminal which is in parallel with the principal faces of the semiconductor device.

The semiconductor device may further include a third electrode layer formed on the first principal face of the semiconductor chip, and a third metal electrode terminal electrically adhered to the third electrode layer so that a part of the third metal electrode terminal is protruded out of the one of the side faces of the semiconductor chip. The part of the third metal electrode terminal has a soldering face which is perpendicular to the first and second principal faces of the semiconductor chip, and which is coplanar with the soldering faces of the first and second metal electrode terminals.

When the semiconductor device includes the first, second and third metal electrode terminals, it may be formed as a vertical-type power metal oxide semiconductor field effect transistor chip. In this case, the first, second and third electrode layers may be defined as respective source, drain and gate electrode layers.

The electrical adhesion of the respective first and second metal electrode terminals to the first and second electrode layers may be carried out by electrically conductive adhesive layers or solder layers.

Each of the first and second metal electrode terminals may be defined as an L-shaped cross-sectional metal electrode terminal which has a leg portion, and a foot portion perpendicularly and integrally extending from an end of the leg portion, with each of the aforesaid soldering faces being defined as a bottom face of the corresponding foot portion.

Optionally, each of the first and second metal electrode terminals may be defined as a generally elongated-trapezoid cross-sectional metal electrode terminal, with each of the soldering faces being defined as a bottom face of the corresponding generally elongated-trapezoid cross-sectional metal electrode terminal.

In accordance with a second aspect of the present invention, there is provided a method for assembling a plurality of semiconductor devices.

In the method, a first electrode-terminal frame is prepared, and has a plurality of first metal electrode terminals formed therein, with each of the first metal electrode terminals being supported by a first tie bar integrally projected from the first electrode-terminal frame. Also, a second electrode-terminal frame is prepared, and has a plurality of second metal electrode terminals formed therein, with each of the second metal electrode terminals being supported by a second tie bar integrally projected from the second electrode-terminal frame. Further, a plurality of semiconductor chips are prepared. Each of the semiconductor chips features first and second principal faces opposite to each other, and side faces extending therebetween, and has a first electrode layer formed on the first principal face thereof, and a second electrode layer formed on the second principal face thereof. Each of the first metal electrode terminals is electrically adhered to one of the first electrode layers of the semiconductor chips so that a part of the first metal electrode terminal concerned is protruded out of one of the side faces of the semiconductor chip concerned, and each of the second metal electrode terminals is electrically adhered to one of the second electrode layers of the semiconductor chips so that a part of the second metal electrode terminal concerned is protruded out of one of the side faces of the semiconductor chip concerned. Then, each of the semiconductor devices is cut off from the corresponding first and second tie bars of the respective electrode-terminal frames. The parts of the first and second metal electrode terminals, which are adhered to the first and second electrode layers of each of the semiconductor chips, have respective soldering faces which are perpendicular to the first and second principal faces of the semiconductor chip concerned, and which are coplanar with each other.

The first and second metal electrode terminals may be defined as an L-shaped cross-sectional metal electrode terminal. In this case, it is possible to produce each of the first and second electrode-terminal frames from a strip-like metal blank by subjecting it to a punching process and a press/folding process, to thereby obtain the L-shaped cross-sectional metal electrode terminals.

BRIEF DESCRIPTION OF THE DRAWINGS

The present invention will be more clearly understood from the description set forth below, as compared with the prior art semiconductor devices, with reference to the accompanying drawings, wherein.

DESCRIPTION OF THE PREFERRED EMBODIMENT

Before description of an embodiment of the present invention, for better understanding of the present invention, the prior art semiconductor devices will be explained with reference to FIGS. 1A and 1B, FIGS. 2A and 2B, and FIG. 3.

Figure 1A:
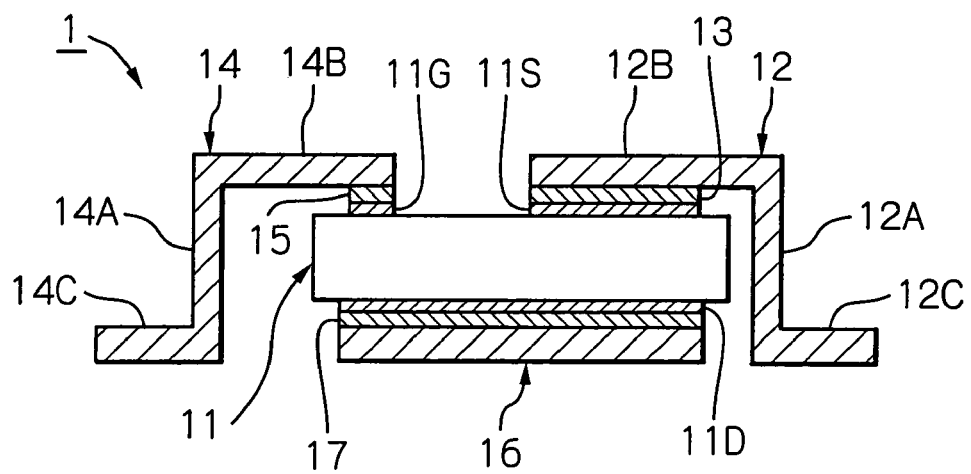
FIG. 1A is a cross-sectional view of a first prior art semiconductor device.

First, referring to FIG. 1A which is a cross-sectional view of a first prior art semiconductor device, a semiconductor device as disclosed in US2002/0179994 A1 is generally indicated by reference numeral 1.

The semiconductor device 1 includes a semiconductor chip 11 which is formed as a vertical-type MOSFET chip. The power MOSFET chip 11 features a rectangular shape having front and rear principal faces opposite to each other, and has a source electrode layer 11S and a gate electrode layer 11G formed on the front principal face thereof, and a drain electrode layer 11D formed on the rear principal face thereof.

The semiconductor device 1 also includes a shaped plate-like electrode terminal 12 having a middle portion 12A, an inner portion 12B inwardly extending from an upper end of the middle portion 12A, and an outer portion 12C outwardly extending from a lower end of the middle portion 12A. The inner portion 12B of the plate-like electrode terminal 12 is securely adhered to the source electrode layer 11S by a solder layer 13 formed therebetween.

The semiconductor device 1 further includes a shaped plate-like electrode terminal 14 having a middle portion 14A, an inner portion 14B inwardly extending from an upper end of the middle portion 14A, and an outer portion 14C outwardly extending from a lower end of the middle portion 12A. The inner portion 14B of the plate-like electrode terminal 14 is securely adhered to the gate electrode layer 11G by a solder layer 15 formed therebetween.

Furthermore, the semiconductor device 1 includes a conductive plate 16 securely adhered to the drain electrode layer 11D by a solder layer 17 formed therebetween.

In the semiconductor device 1, the shaped plate-like electrode terminals 12 and 14 are formed so that the respective outer portions 12C and 14C feature bottom faces which are coplanar with a bottom face of the conductive plate 16.

Figure 1B:
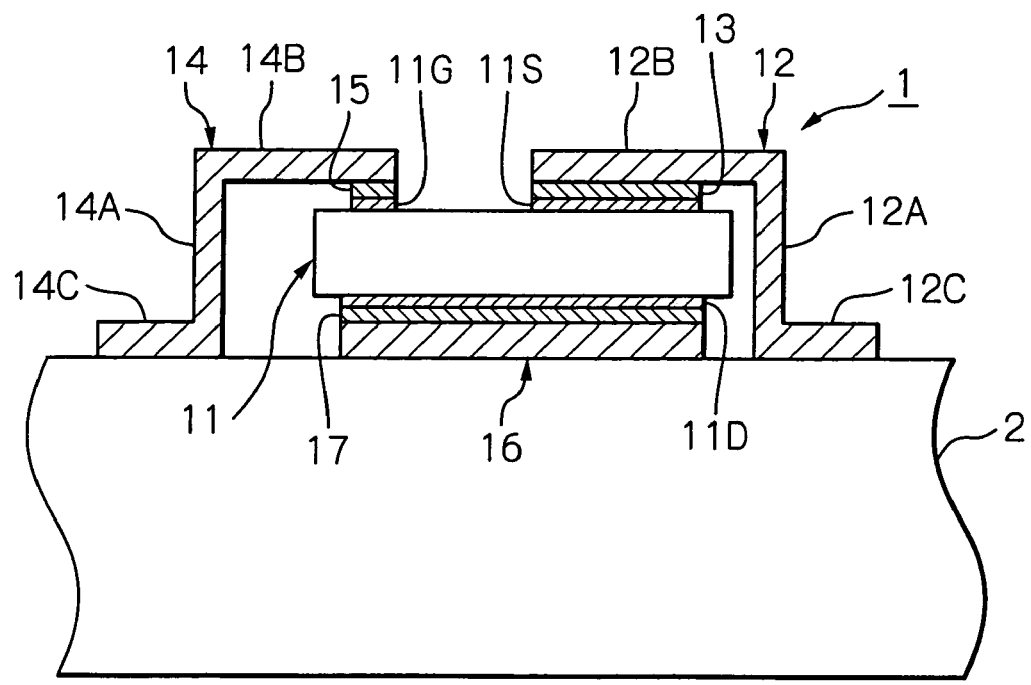
FIG. 1B is a view of a circuit board on which the first prior art semiconductor device of FIG. 1A is mounted.

Referring to FIG. 1B which is a partial-cross sectional view, the semiconductor device 1 of FIG. 1A is mounted on a circuit board 2 so that the bottom faces of the outer portions 12C and 14C and the bottom face of the conductive plate 16 are soldered to respective electrode pads (not shown) formed on a top surface of the circuit board 2.

With the mounting structure of FIG. 1B, in which the semiconductor device 1 is mounted on the circuit board 2, the shaped plate-like electrode terminals 12 and 14 and the conductive plate 16 form an effective heat-radiator system. Namely, although the power MOSFET chip 11 generates a large amount of heat during the operation thereof, it is possible to facilitate radiation of heat from the power MOSFET chip 11 by the effective heat-radiator system (12, 14 and 16), because each of the shaped plate-like electrode terminals 12 and 14 functions as a heat-radiator fin for radiating heat in air, and because the conductive plate 16 functions as a thermal conductor for conducting heat from the power MOSFET chip 11 into the circuit board 2.

Nevertheless, in the mounting structure of FIG. 1B, the semiconductor device 1 fails to diminish a mounting area of the circuit board 2 which is occupied by the mounted semiconductor device 1, because the mounting area is considerably larger than that of the front and rear principal faces of the power MOSFET chip 11 per se.

Figure 2A:
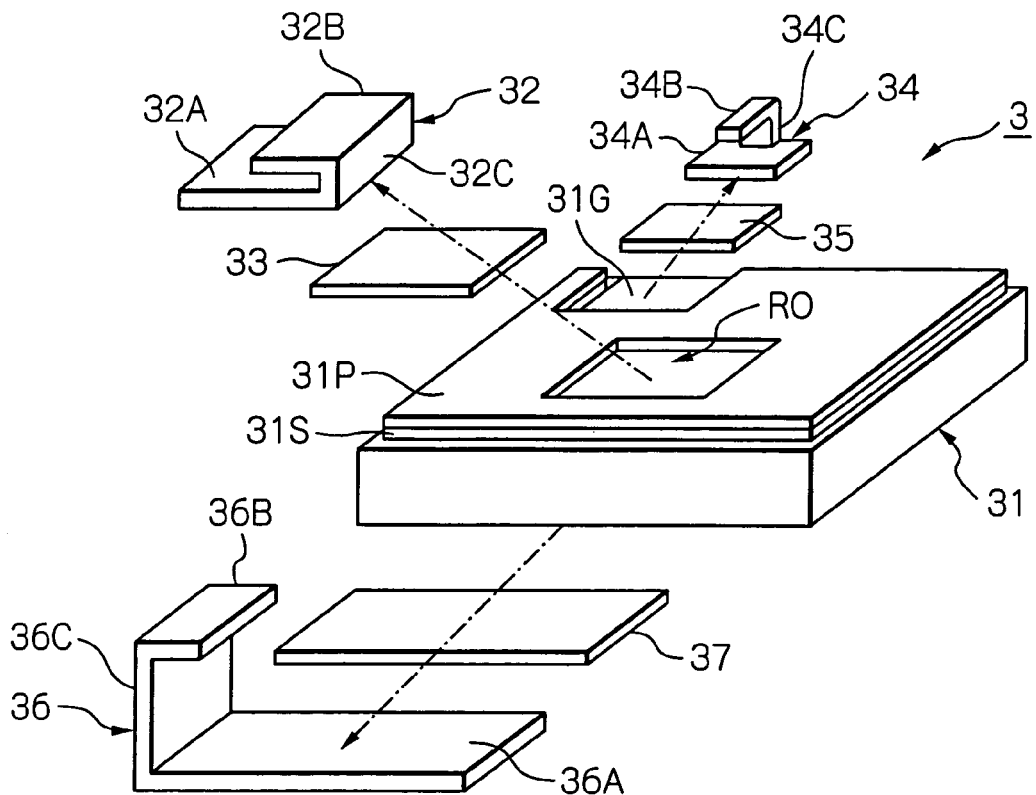
FIG. 2A is a perspective exploded view of a second prior art semiconductor device.

Next, referring to FIG. 2A which is a perspective exploded view of a second prior art semiconductor device, a semiconductor device as disclosed in U.S. Pat. No. 6,841,865 B1 is generally indicated by reference numeral 3.

The semiconductor device 3 includes a semiconductor chip 31 which is formed as a vertical-type power MOSFET chip. The power MOSFET chip 31 also features a rectangular shape having front and rear principal faces opposite to each other, and has a source electrode layer 31S and a gate electrode layer 31G formed on one of the front principal faces thereof, and a drain electrode layer 31D (visible not in FIG. 2A but in FIG. 2B) formed the rear principal face thereof. The power MOSFET chip 31 also has a passivation layer 31P formed over the source electrode layer 31S, and a rectangular opening R0 is formed in the passivation layer 31P so that a part of the source electrode layer 31S is exposed to the outside.

The semiconductor device 3 also includes a clip-type electrode terminal 32 having a base portion 32A, a contact portion 32B, and a middle portion 32C integrally connecting between the base portion 32A and the contact portion 32B, with the base portion 32A and the contact portion 32B being parallel with each other. The base portion 32A of the clip-type electrode terminal 32 is securely adhered to the exposed part of the source electrode layer 31S by a solder layer 33 formed therebetween.

The semiconductor device 3 further includes a clip-type electrode terminal 34 having a base portion 34A, a contact portion 34B, and a middle portion 34C integrally connecting between the base portion 34A and the contact portion 34B, with the base portion 34A and the contact portion 34B being parallel with each other. The base portion 34A of the clip-type electrode terminal 34 is securely adhered to the gate electrode layer 31G by a solder layer 35 formed therebetween.

Furthermore, the semiconductor device 3 includes a clip-type electrode terminal 36 having a base portion 36A, a contact portion 36B, and a middle portion 36C integrally connecting between the base portion 36A and the contact portion 36B, with the base portion 36A and the contact portion 36B being parallel with each other. The base portion 36A of the clip-type electrode terminal 36 is securely adhered to the drain electrode layer 31D (visible not in FIG. 2A but in FIG. 2B) by a solder layer 37 formed therebetween.

In the semiconductor device 3, the clip-type electrode terminals 32, 34 and 36 are formed so that the respective contact portions 32B, 34B and 36B feature bottom faces which are coplanar with each other.

Figure 2B:
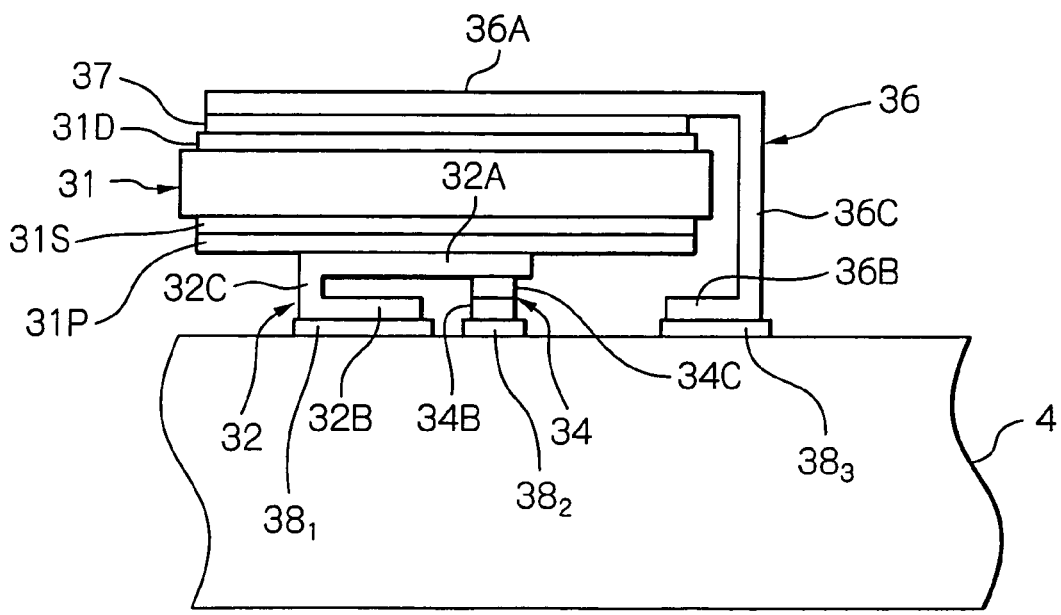
FIG. 2B is a view of a circuit board on which the semiconductor device of FIG. 2A is mounted.

Referring to FIG. 2B, the semiconductor device 3 of FIG. 2A is mounted on a circuit board 4 so that the respective outer faces of the contact portions 32B, 34B and 36B of the clip-type electrode terminals 32, 34 and 36 are securely adhered by solder layers $38_1$, $38_2$ and $38_3$ to electrode pads (not shown) formed on a surface of the circuit board 4. Namely, the mounting of the semiconductor device 3 of FIG. 2A on the circuit board 4 is carried out by turning over the semiconductor device 3.

With the mounting structure of FIG. 2B, in which the semiconductor device 3 is mounted on the circuit board 4, the clip-type electrode terminals 32, 34 and 36 also form an effective heat-radiator system. Namely, each of the clip-type electrode terminals 32, 34 and 36 functions as a heat-radiator fin for radiating heat in air, to thereby facilitate radiation of heat from the power MOSFET chip 31.

When the power MOSFET chip 31 of FIGS. 2A and 2B is the same size as the power MOSFET chip 11 of FIGS. 1A and 1B, a mounting area of the circuit board 4, which is occupied by the mounted semiconductor device 3 on the circuit board 4, is smaller than a mounting area of the circuit board 6 that occupied by the semiconductor device 11 of FIGS. 1A and 1B, because only a part of the clip-type electrode terminal 36 is protruded out of the area which is vertically projected by the power MOSFET chip 31 on the top surface of the circuit board 4.

In either event, as long as the semiconductor device 1 or 3 is mounted on the circuit board 2 or 4 so that the front and rear principal face of the power MOSFET chip 11 or 31 is in parallel with the top surface of the circuit board 2 or 4, it is impossible to make the mounting area of the semiconductor device 1 or 3 on the circuit board 2 or 4 smaller than the area of the front and rear principal faces thereof.

Figure 3:
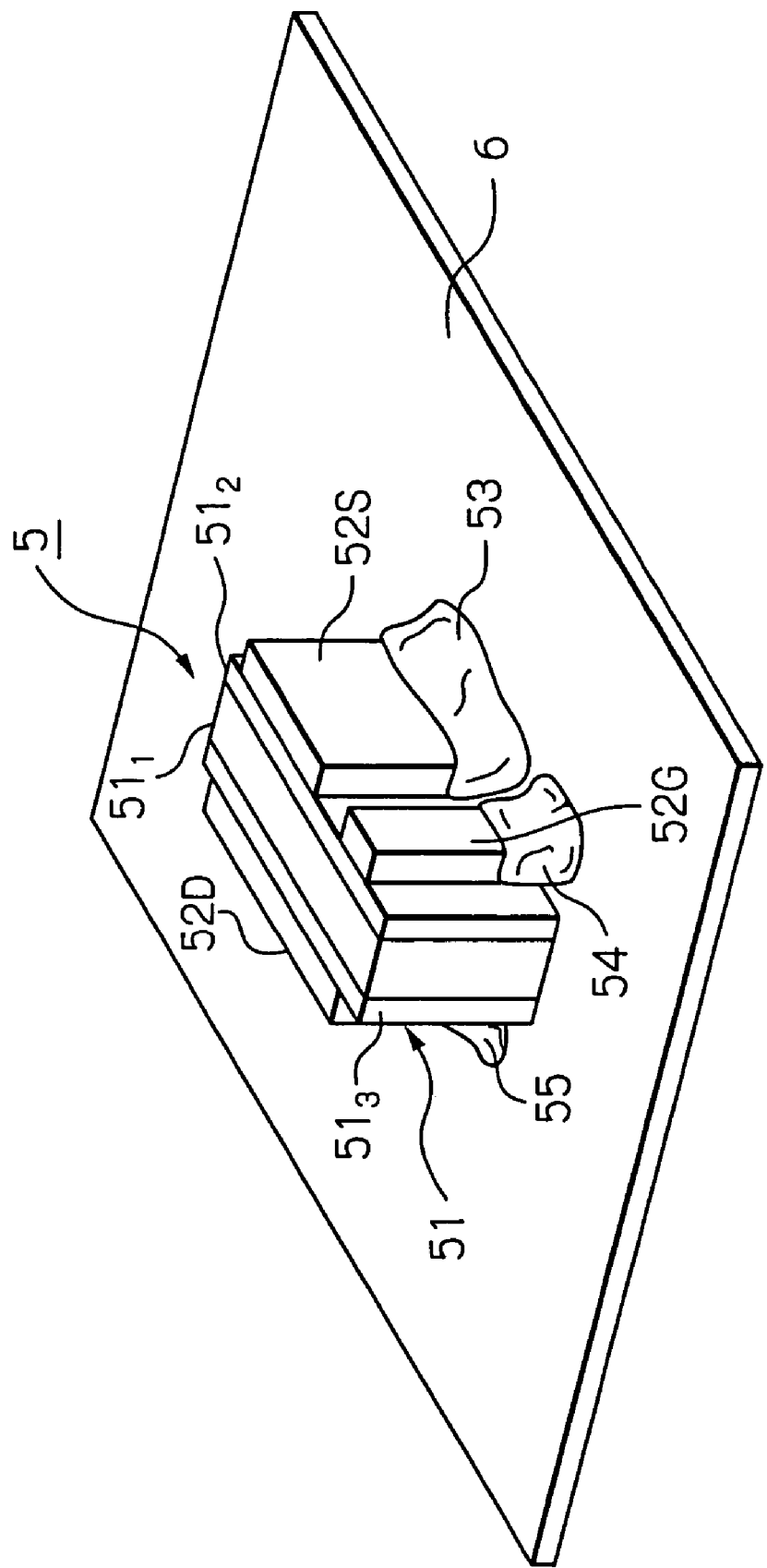
FIG. 3 is a perspective view of a third prior art semiconductor device mounted on a circuit board.

Next, referring to FIG. 3 which is a perspective view of a third prior art semiconductor device, a semiconductor device as disclosed in U.S. Pat. No. 7,030,445 B2 is generally indicated by reference numeral 5.

The semiconductor device 5 includes a semiconductor chip 51 which is formed as a vertical-type power MOSFET chip. The power MOSFET chip 51 has a semiconductor substrate $51_1$, and respective outermost layers $51_2$ and $51_3$ formed on faces of the silicon substrate $51_1$, opposite to each other, with the outer faces of the outermost layers $51_2$ and $51_3$ being defined as front and rear principal faces, respectively.

In FIG. 3, although the power MOSFET chip 51 has an exaggerated thickness, in reality, the thickness of the power MOSFET chip 51 is very small. Although the thickness is variable depending on the size of the power MOSFET chip 51, for example, it may fall within the range from 200 to 300 μm. Note, the same is true for the semiconductor devices 1 and 3 of FIGS. 1A and 1B and FIGS. 2A and 2B.

The semiconductor device 5 also includes a source electrode terminal layer 52S and a gate electrode terminal layer 52G formed on the front principal face of the outermost layer $51_2$, and a drain electrode terminal layer 52D formed on the rear principal face of the outermost layer $51_3$.

The source electrode terminal layer 52S extends on the outermost layer $51_2$ between the long sides of the power MOSFET chip 51 opposite to each other so that the respective end faces of the source terminal layer 52S are coplanar with the long side faces of the power MOSFET chip 51.

Similarly, the gate electrode terminal layer 52G extends on the outermost layer $51_2$ between the long sides of the power MOSFET chip 51 so that the respective end faces of the gate terminal layer 52G are coplanar with the long side faces of the power MOSFET chip 51.

Also, the drain electrode terminal layer 52D extends on the outermost layer $51_3$ between the opposite long sides of the power MOSFET chip 51 so that the respective end faces of the source electrode terminal layer 52D are coplanar with the opposite long side faces of the power MOSFET chip 51.

As shown in FIG. 3, the semiconductor device 5 is mounted on a circuit board 6.

In particular, when the semiconductor device 5 is mounted on the circuit board 6, first, the semiconductor device 5 is placed on the circuit board 6 so that one of the long side faces of the power MOSFET chip 51 is in contact with a top surface of the circuit board 6, and is positioned so that the corresponding end faces of the source, gate and drain electrode terminal layers 52S, 52G and 52D are contacted with respective electrode pads (not shown) formed on the top surface of the circuit board 6. Then, the source, gate and drain electrode terminal layers 52S, 52G and 52D are soldered by solder fillets 53, 54 and 55 to the respective electrode pads (not shown).

In comparison of the mounting structure of the semiconductor device 5 on the circuit board 6 of FIG. 3 with the respective mounting structures of the semiconductor devices 1 and 3 on the circuit boards 2 and 4 of FIGS. 1B and 2B, it is possible to considerably diminish a mounting area of the circuit board 6 which is occupied by the semiconductor device 5, because the side face of the semiconductor device 5 is in contact with the top surface of the circuit board 6.

In the mounting structure of the semiconductor device 5 on the circuit board 6 of FIG. 3, although the source, gate and drain electrode terminal layers 52S, 52G and 52D form a heat radiation system, a heat radiation effect of the heat radiation system is inferior to those of the heat radiation systems of the semiconductor devices 1 and 3 of FIGS. 1B and 2B, because the mounting structure of FIG. 3 has no passages through which air can pass.

Also, in the mounting structure of the semiconductor device 5 on the circuit board 6 of FIG. 3, the solder fillets 53, 54 and 55 are liable to cause short circuits because the solder fillets 53, 54 and 55 may be easily contacted with the power MOSFET chip 51 due to the semiconductor device 5 being in contact with the top surface of the circuit board 6.

Figure 4:
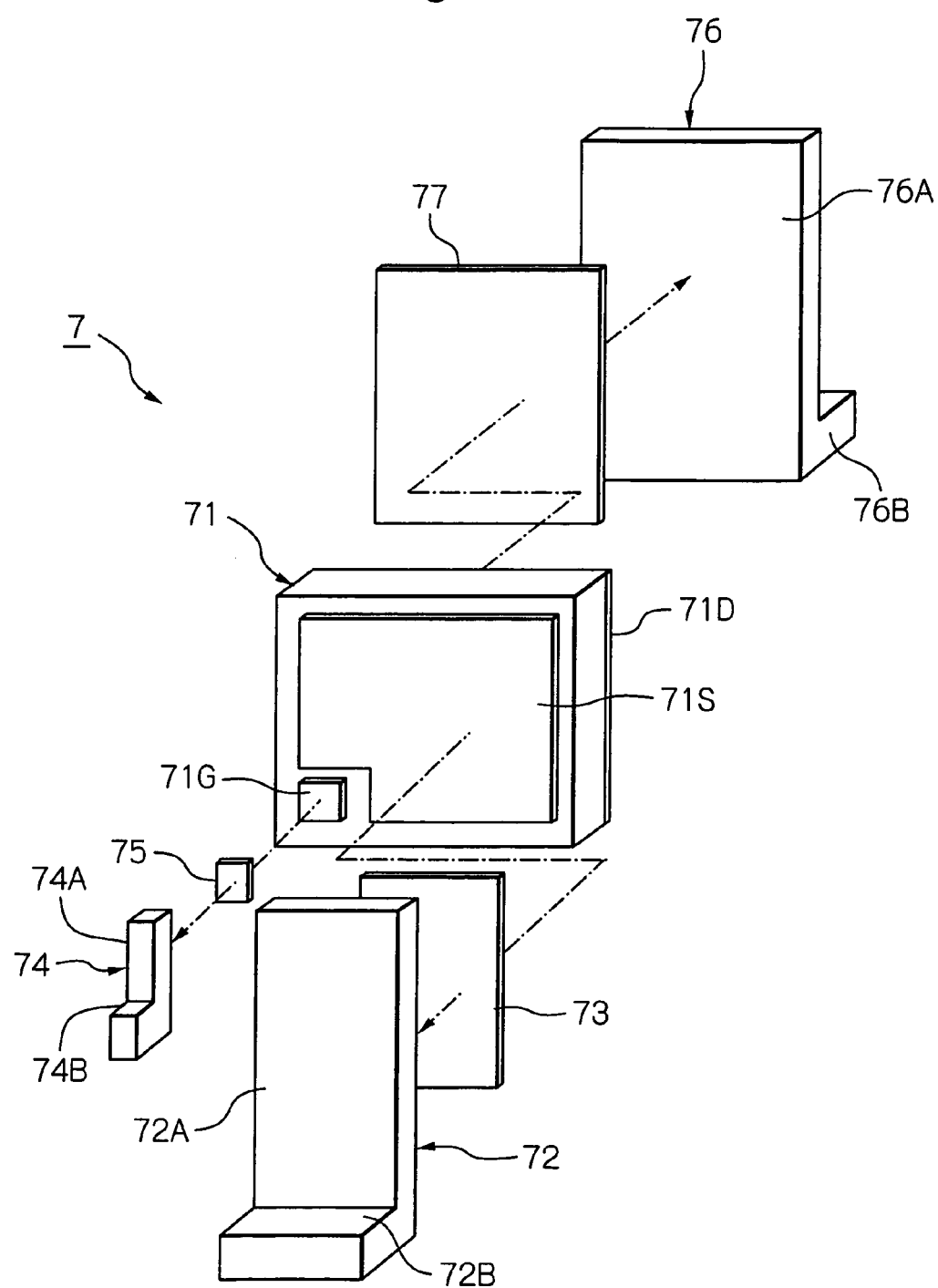
FIG. 4 is a perspective exploded view showing an embodiment of a semiconductor device according to the present invention.
Figure 5:
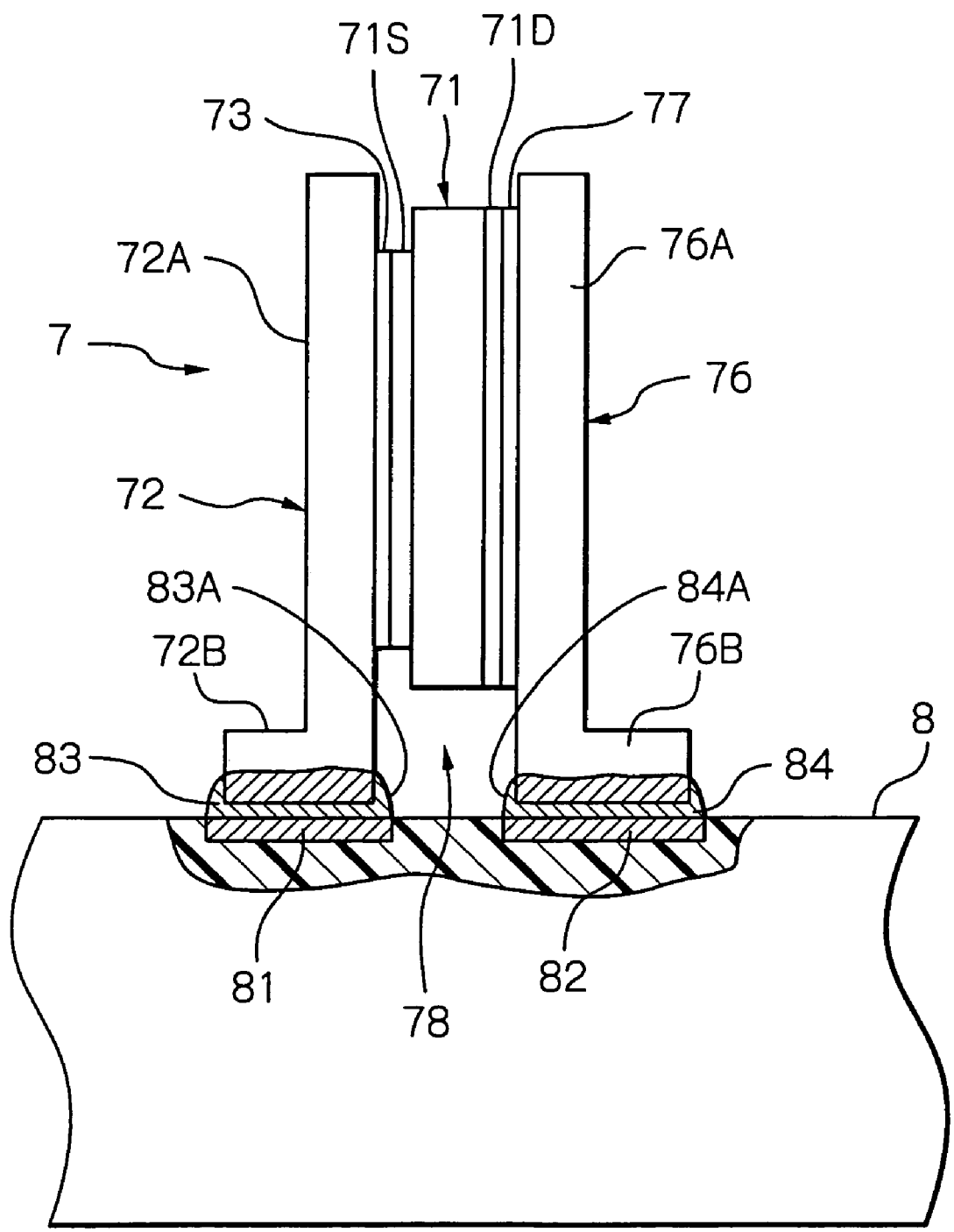
FIG. 5 is a partially-cut-away view of a circuit board on which the semiconductor device of FIG. 4 is mounted.

With reference to FIGS. 4 and 5, an embodiment of a semiconductor device according to the present invention is explained below.

First, referring to FIG. 4 which is a perspective exploded view of an embodiment of a semiconductor device according to the present invention, a semiconductor device is generally indicated by reference numeral 7.

The semiconductor device 7 includes a semiconductor chip 71 which is formed as a vertical-type power MOSFET chip. The power MOSFET chip 71 is formed as a rectangular parallelepiped featuring front and rear principal faces opposite to each other, and four side faces extending therebetween, and has a source electrode layer 71S and a gate electrode layer 71G formed on the front principal face thereof, and a drain electrode layer 71D formed on the rear principal face thereof.

The semiconductor device 7 also includes a metal electrode terminal 72 made of a suitable metal material, such as copper, copper alloy or the like, exhibiting a good thermal conductivity and a good wettability by melted solder. The metal electrode terminal 72 is defined as an L-shaped cross-sectional metal electrode terminal which has a leg portion 72A, and a foot portion 72B perpendicularly and integrally extending from a lower end of the leg portion 72A. The leg portion 72A of the metal electrode terminal 72 is securely adhered to the source electrode layer 71S by an electrically conductive adhesive layer or solder layer 73 so that the lower end part of the metal electrode terminal 72, which includes the foot portion 72B, is protruded out of a side face or bottom side face of the power MOSFET chip 71, and so that the foot portion 72B is directed so as to be further apart from the source electrode layer 71S.

The semiconductor device 7 further includes a metal electrode terminal 74 which may be made of the same metal material as that of the metal electrode terminal 72. The metal electrode terminal 74 is also defined as an L-shaped cross-sectional metal electrode terminal which has a leg portion 74A, and a foot portion 74B perpendicularly and integrally extending from a lower end of the leg portion 74A. Similar to the metal electrode terminal 72, the leg portion 74A of the metal electrode terminal 74 is securely adhered to the gate electrode layer 71G by an electrically conductive adhesive layer or solder layer 75 so that the lower end part of the metal electrode terminal 74, which includes the foot portion 74B, is protruded out of the bottom side face of the power MOSFET chip 71, and so that the foot portion 74B is directed so as to be further apart from the gate electrode layer 71G.

Furthermore, the semiconductor device 7 includes a metal electrode terminal 76 which may be made of the same metal material as that of the metal electrode terminal 72. The metal electrode terminal 76 is also defined as an L-shaped cross-sectional metal electrode terminal which has a leg portion 76A, and a foot portion 76B perpendicularly extending from a lower end of the leg portion 76A. Similar to the metal electrode terminal 72, the leg portion 76A of the metal electrode terminal 76 is securely adhered to the drain electrode layer 71D by an electrically conductive adhesive layer or solder layer 77 so that the lower end part of the metal electrode terminal 76, which includes the foot portion 76B, is protruded out of the bottom side face of the power MOSFET chip 71, and so that the foot portion 76B is directed so as to be further apart from the drain electrode layer 71D.

Note that the adhesion of the leg portions 72A, 74A and 76A to the respective source, gate and drain electrode layers 71S, 71G and 71D is carried out so that bottom faces of the foot portions 72B, 74B and 76B of the metal electrode terminals 72, 74 and 76 are coplanar with each other, with each of the bottom faces of the foot portions 72B, 74B and 76B serving as a soldering face.

Referring to FIG. 5 which is a partially-cut-away view of the semiconductor device 7 of FIG. 4 mounted on a circuit board 8, the respective bottom faces or soldering faces of the foot portions 72B, 74B and 76B of the metal electrode terminals 72, 74 and 76 are securely adhered by solder layers to electrode pads formed on a top surface of the circuit board 8.

Note, in FIG. 5, only the electrode pads, to which the respective foot portions 72B and 76B are adhered, are indicated by reference 81 and 82, and the electrode pad, to which the foot portion 74B is adhered, is not visible.

Also, note, in FIG. 5, only the solder layers, by which the respective foot portions 72B and 76B are adhered to the electrode pads 81 and 82, are indicated by reference 83 and 84, and the solder layer, by which the foot portion 74B is adhered to the corresponding electrode pad, is not visible.

As shown in FIG. 5, although the respective solder layers 83 and 84 have solder fillets 83A and 84A extending along the peripheral edges of the electrode pads 81 and 82, the solder fillets 83A and 84A cannot be contacted with the power MOSFET chip 71 because the bottom face of the power MOSFET chip 71 is positioned above the top surface of the circuit board 8. Of course, the same is true for the solder fillet of the solder layer (not visible) by which the foot portion 74B is adhered to the corresponding electrode pad (not visible).

In short, the solder fillets (83A, 84A) of the solder layers (83, 84) cannot cause short circuits because the power MOSFET chip 71 can be prevented from being contacted with the solder fillets (83A, 84A).

Note, in FIG. 5, for example, the space between the metal electrode terminals 72 and 76 may fall within the range from 200 to 300 μm. Also, note, for example, the thickness of both the source electrode layer 71S and the solder layer 73 may fall within the range 40 from 50 μm, and the thickness of both the drain electrode layer 71D and the solder layer 77 may fall within the range 40 from 50 μm.

Furthermore, with the mounting structure of the semiconductor device 7 on the circuit board 8 of FIG. 5, the metal electrode terminals 72, 74 and 76 form a heat-radiator system for radiating heat from the power MOSFET chip 71, and the heat-radiator system features an air passage 78, through which air can pass.

In particular, the air passage 78 is defined between the lower end parts of the metal electrode terminals 72 and 74, which include the foot portions 72B and 74B, and the lower end part of the metal electrode terminal 76, which includes the foot portion 76B, due to the bottom face of the power MOSFET chip 71 being positioned above the top surface of the circuit board 8. Thus, it is possible to facilitate the radiation of heat from the power MOSFET chip 71 due to the existence of the air passage 78.

Incidentally, in the semiconductor device 7 of FIGS. 4 and 5, an arrangement of the metal electrode terminals 72, 74 and 76 is contrived so that the semiconductor device 7 itself can stand when being placed on a plane so that the bottom faces or soldering faces of the foot portions 72B, 74B and 76B are in contact with the plane, whereby the soldering of the semiconductor device 7 to the circuit board 8 can be easily and stably carried out.

Next, with reference to FIGS. 6A through 6E, a method for assembling a plurality of semiconductor devices of FIG. 4 is explained below.

Figure 6A:
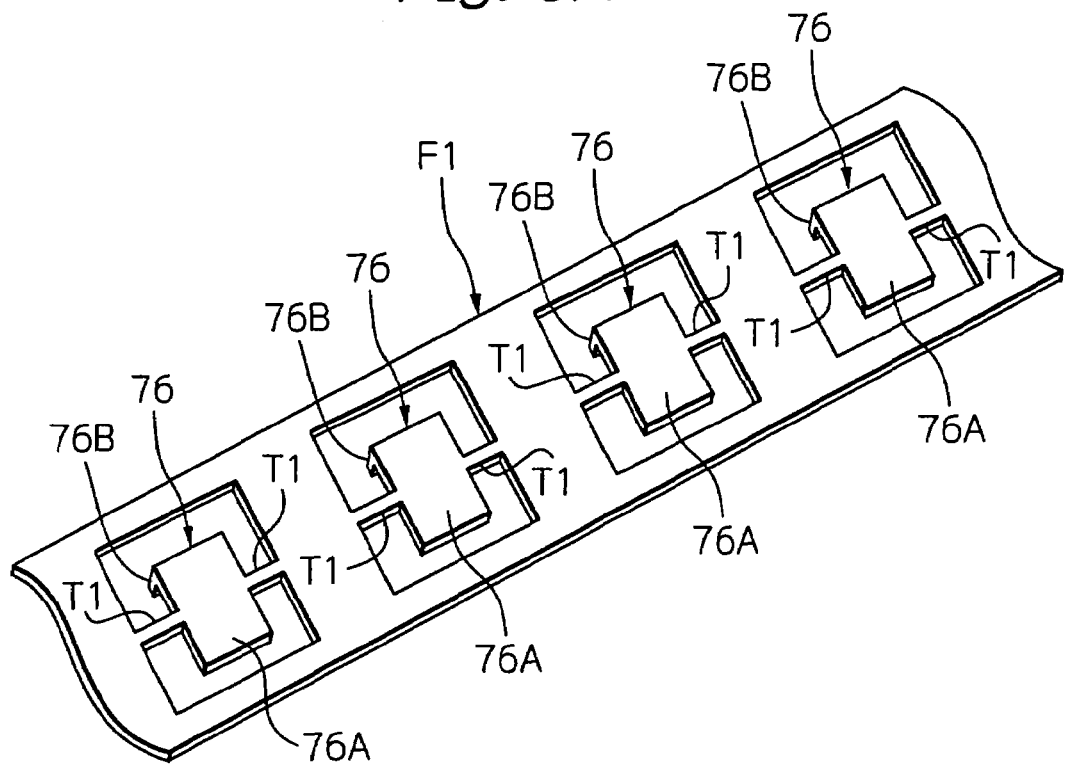
FIGS. 6A through 6E are explanatory views showing a method for assembling a plurality of semiconductor devices according to the present invention.

First, as shown in FIG. 6A which is a perspective view, an electrode-terminal frame F1, which is formed with a plurality of L-shaped cross-sectional metal electrode terminals 76, is prepared. For example, it is possible to produce the electrode-terminal frame F1 from a strip-like copper or copper alloy blank by subjecting it to a punching process and a press/folding process, to thereby obtain the L-shaped cross-sectional metal electrode terminals 76.

Each of the metal electrode terminals 76 is defined as an L-shaped cross-sectional metal electrode terminal which has a leg portion 76A, and a foot portion 76B perpendicularly and integrally extending from a lower end of the leg portion 76A (see: FIG. 4). Also, each of the metal electrode terminals 76 is supported by a pair of tie bars T1 which are integrally projected from the electrode-terminal frame F1, and which are integrally connected to the opposite sides of the leg portion 76A.

Figure 6B:
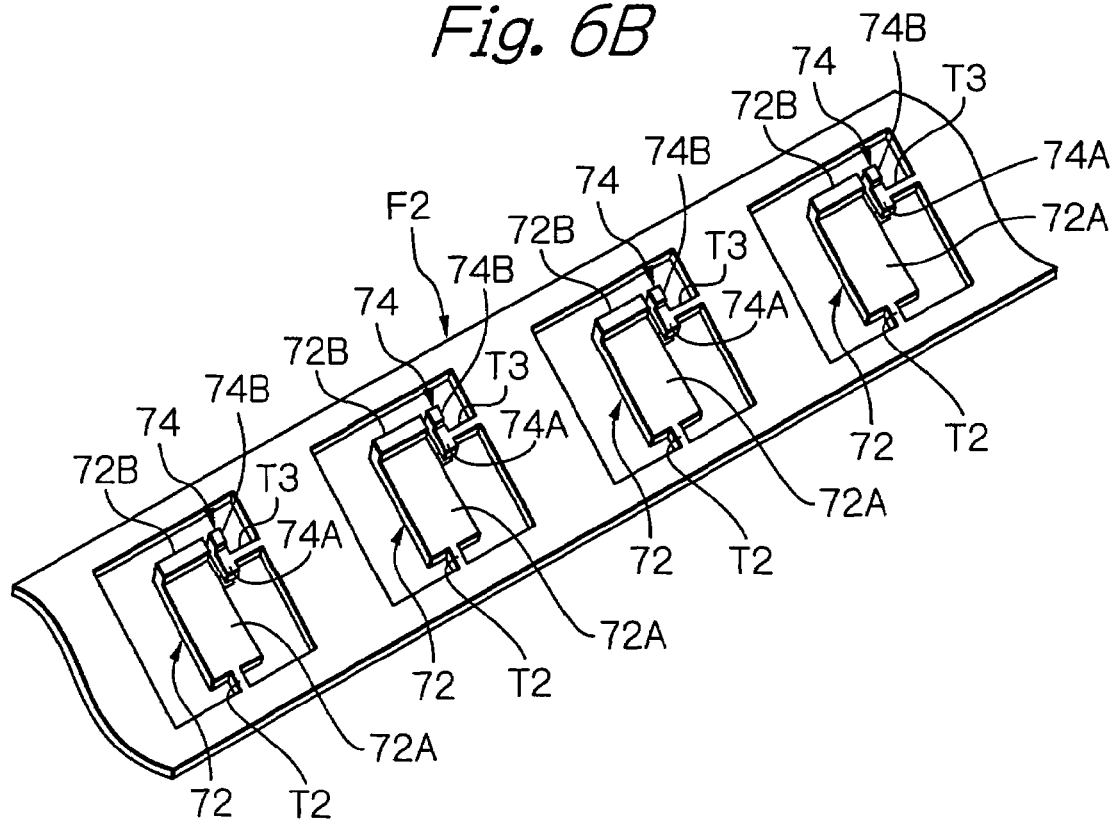

Next, as shown in FIG. 6B which is a perspective view, an electrode-terminal frame F2, which is formed with a plurality of L-shaped cross-sectional metal electrode terminals 72 and a plurality of L-shaped cross-sectional metal electrode-terminals 74, is prepared. Similar to the electrode-terminal frame F1, it is possible to produce the electrode-terminal frame F2 from a strip-like copper or copper alloy blank by subjecting it to a punching process and a press/folding process, to thereby obtain the L-shaped cross-sectional metal electrode terminals 72 and 74.

Each of the metal electrode terminals 72 is defined as an L-shaped cross-sectional metal electrode terminal which has a leg portion 72A, and a foot portion 72B perpendicularly and integrally extending from a lower end of the leg portion 72A (see: FIG. 4). Also, each of the metal electrode terminals 72 is supported by a tie bar T2 which is integrally projected from the electrode-terminal frame F2, and which is integrally connected to a top end of the leg portion 72A.

Similarly, each of the metal electrode terminals 74 is defined as an L-shaped cross-sectional metal electrode terminal which has a leg portion 74A, and a foot portion 74B perpendicularly and integrally extending from a lower end of the leg portion 74A (see: FIG. 4). Also, each of the metal electrode terminals 74 is supported by a tie bar T3 which is integrally projected from the electrode-terminal frame F2, and which is integrally connected to a side of the leg portion 74A.

Figure 6C:
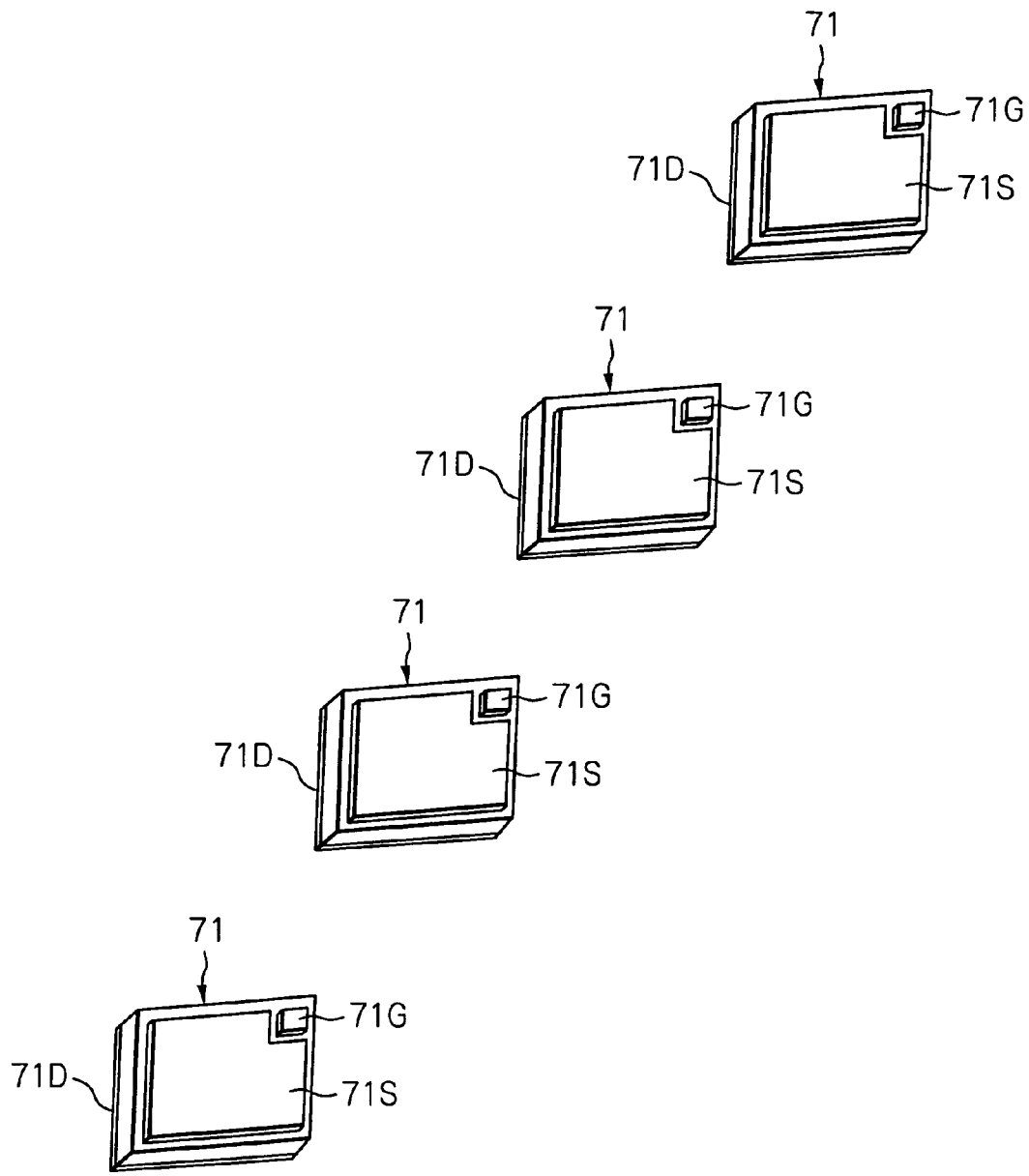

Next, as shown by way of example in FIG. 6C which is a perspective view, a plurality of power MOSFET chips 71 (see: FIG. 4) are prepared. Each of the power MOSFET chips 71 is formed as a rectangular parallelepiped featuring opposite front and rear principal faces, and four side faces extending therebetween, and has a source electrode layer 71S and a gate electrode layer 71G formed on the front principal face thereof, and a drain electrode layer 71D formed on the rear principal face thereof.

Figure 6D:
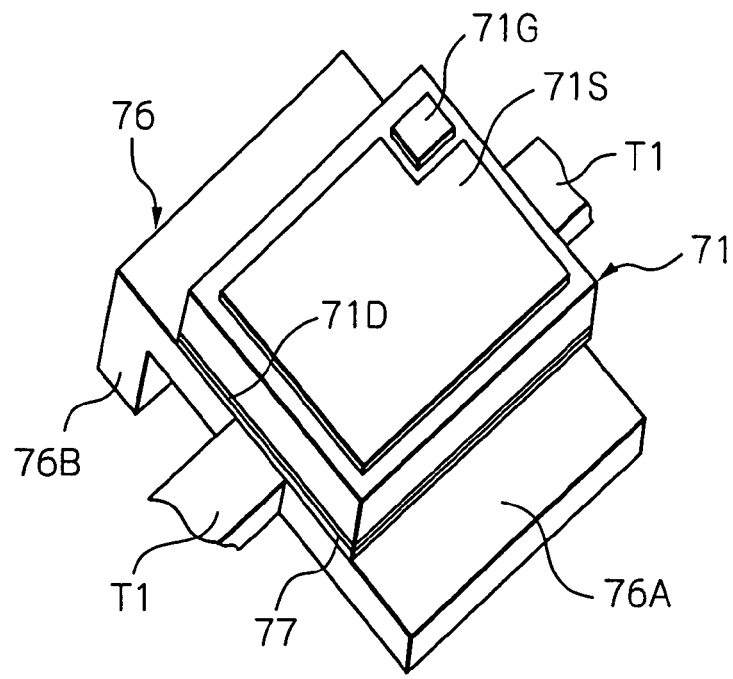

Next, as representatively shown in FIG. 6D which is a perspective view, each of the power MOSFET chips 71 is mounted on the corresponding metal electrode terminal 76 of the electrode-terminal frame F1 (see: FIG. 6A) such that the drain electrode layer 71D is adhered by an electrically conductive adhesive layer or solder layer 77 to the leg portion 76A of the metal electrode terminal 76.

The adhesion of the drain electrode layer 71D to the leg portion 76A is carried out so that the lower end part of the metal electrode terminal 76, which includes the foot portion 76B, is protruded out of a side face or bottom side face of the power MOSFET chip 71.

Figure 6E:
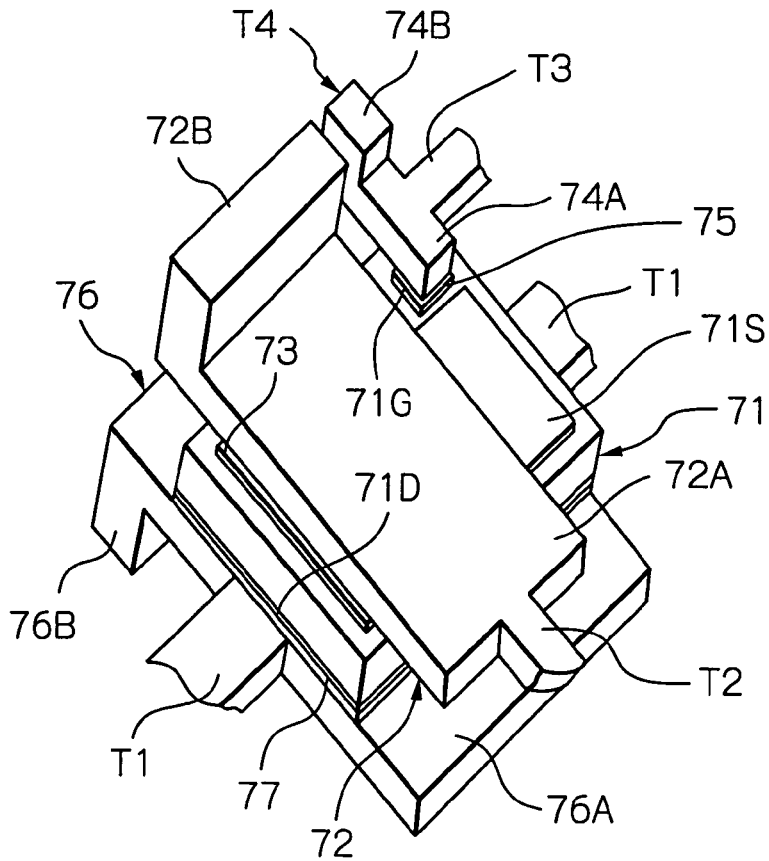

Next, as representatively shown in FIG. 6E which is a perspective view, the electrode-terminal frame F2 (see: FIG. 6B) is applied to the power MOSFET chips 71 mounted on the respective metal electrode terminals 76 of the electrode-terminal frame F1 (see: FIG. 6A), and a set of metal electrode terminals 72 and 74 of the electrode-terminal frame F2 are adhered by electrically conductive adhesive layers or solder layers 73 and 75 to the respective source electrode layer 71S and gate electrode layer 71G of the power MOSFET chip 71, resulting in completion of the assembly of the plurality of semiconductor devices 7 (see: FIG. 4).

The adhesion of the source electrode layer 71S to the leg portion 72A is carried out so that the lower end part of the metal electrode terminal 72, which includes the foot portion 72B, is protruded out of the bottom side face of the power MOSFET chip 71.

Similarly, the adhesion of the gate electrode layer 71G to the leg portion 74A is carried out so that the lower end part of the metal electrode terminal 74, which includes the foot portion 74B, is protruded out of the bottom side face of the power MOSFET chip 71.

Note, as shown in FIG. 6E, the bottom faces of the foot portions 72B, 74B and 76B are coplanar with each other, with each of the bottom faces of the foot portions 72B, 74B and 76B serving as a soldering face.

Thereafter, the semiconductor devices 7 are cut off from the tie bars T1, T2 and T3 of the electrode-terminal frames F1 and F2.

Figure 7A:
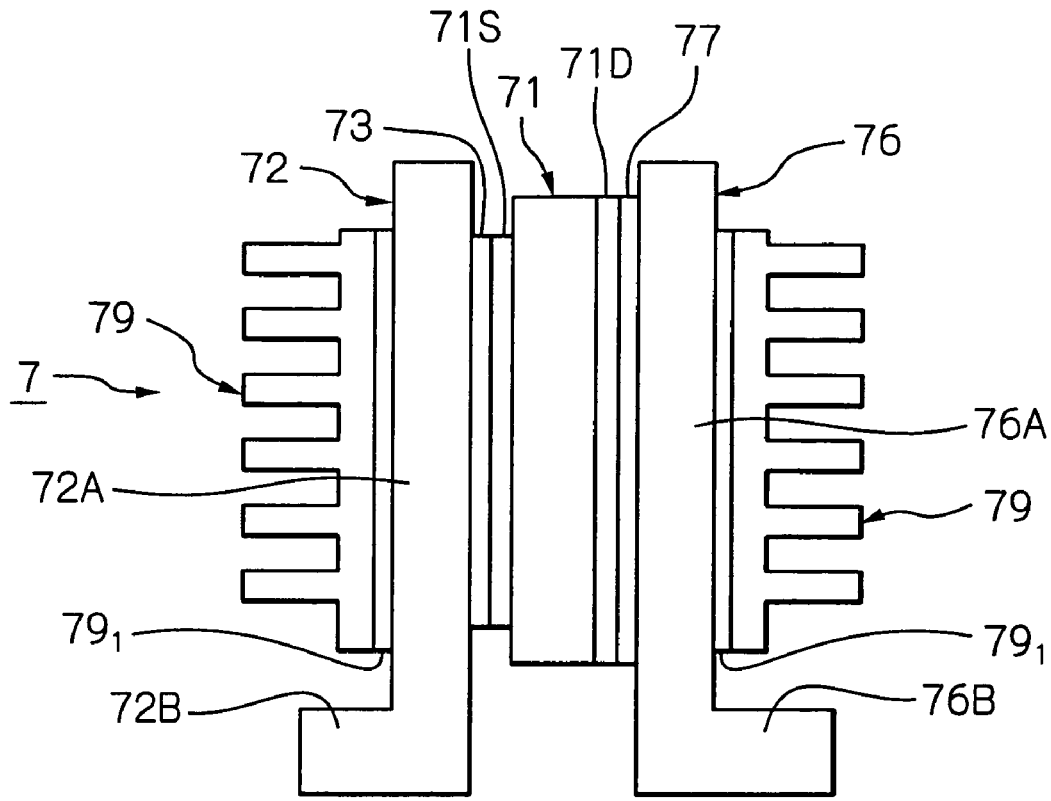
FIG. 7A is an elevation view showing a first modification of the semiconductor device of FIG. 4.

FIG. 7A is an elevation view showing a first modification of the semiconductor device 7 of FIG. 4.

In the first modification, the semiconductor device 7 is provided with respective finned heat-radiators 79 which are adhered by adhesive layers $79_1$, to the outer faces of the leg portions 72A and 76A of the metal electrode terminals 72 and 76. Each of the finned heat-radiators 79 may be made of a suitable metal material, such as copper, copper alloy, aluminum or the like. When the finned heat-radiators 79 are made of either copper or copper alloy, each of the adhesive layers $79_1$, may be formed as a solder layer. Also, when the finned heat-radiators 79 are made of aluminum, each of the adhesive layers $79_1$, may be formed as a silver paste layer.

Figure 7B:
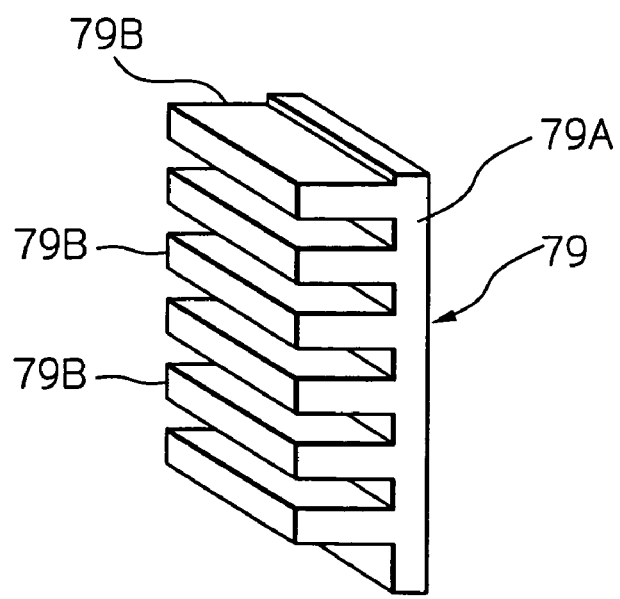
FIG. 7B is a perspective view of the finned heat-radiator of FIG. 7A.

As shown in FIG. 7B which is a perspective view of the finned heat-radiators 79 of FIG. 7A, each of the finned heat-radiators 79 has a plate-like portion 79A, and a plurality of fins 79B integrally protruded from the plate-like portion 79A. Thus, since each of the finned heat-radiators 79 features a large heat-radiation area due to the existence of the plurality of fins 79B, it is possible to considerably facilitate radiation of heat from the power MOSFET chip 71.

Note, in the modification of FIG. 7A, another finned heat-radiator (not shown) may be adhered to the outer face of the leg portion 74A of the metal electrode terminal 74 (see: FIG. 4).

Figure 8:
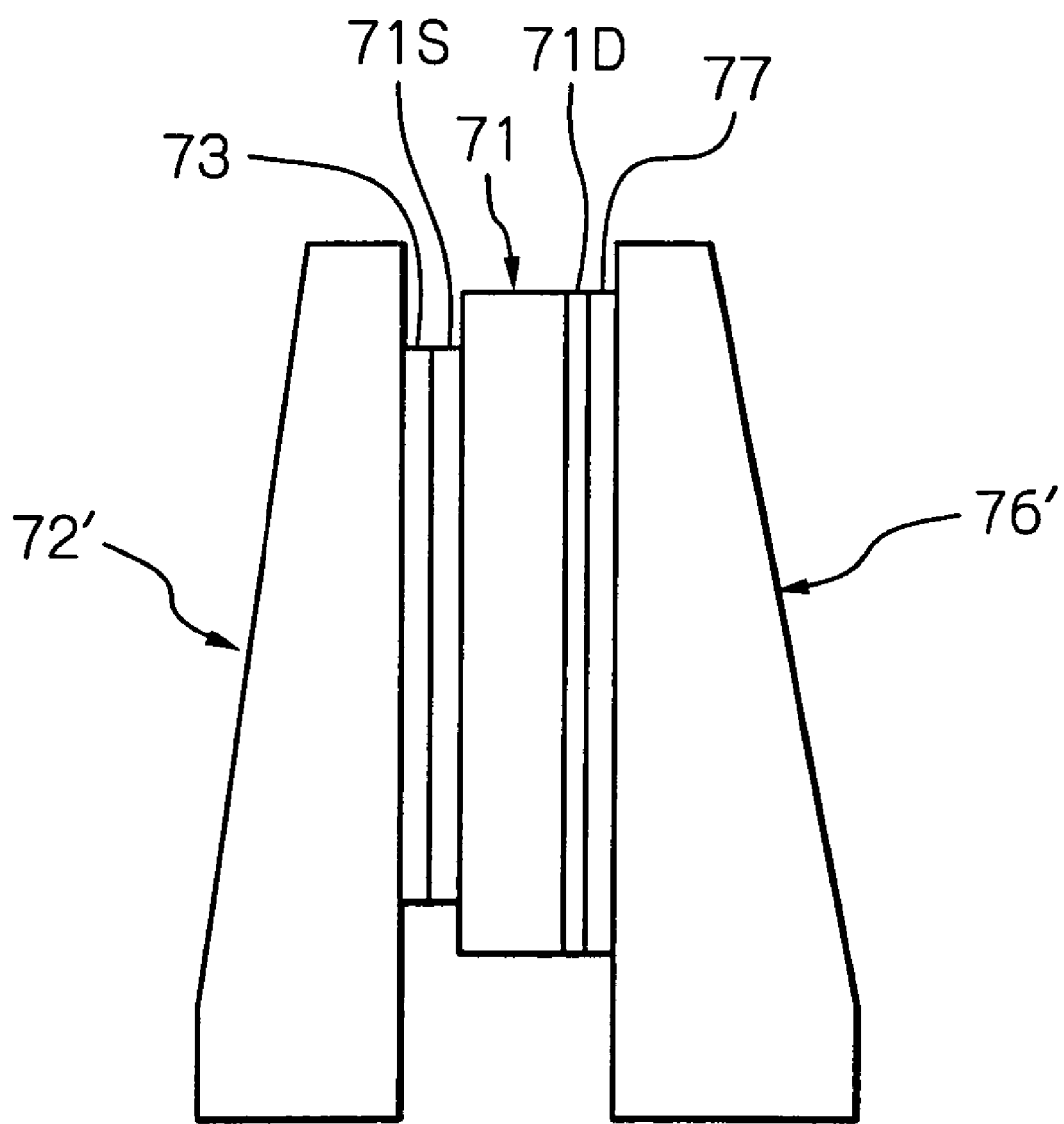
FIG. 8 is an elevation view showing a second modification of the semiconductor device of FIG. 4.

FIG. 8 is an elevation view showing a second modification of the semiconductor device 7 of FIG. 4.

In the second modification, the L-shaped cross-sectional metal electrode-terminals 72 and 76 of FIG. 4 are replaced with elongated generally-trapezoid cross-sectional metal electrode-terminals 72' and 76'. Although not illustrated, of course, the metal electrode-terminal 74 (see: FIG. 4) is also replaced with an elongated generally-trapezoid cross-sectional metal electrode terminal. In this case, the bottom faces of the metal electrode-terminals (72', 76') are coplanar with each other, and serve as soldering faces.

The elongated generally-trapezoid cross-sectional metal electrode-terminals (72', 76') are thicker than the L-shaped cross-sectional metal electrode terminals 72, 74 and 76, and thus have a larger heat-sink capacity than that of the metal electrode terminals 72, 74 and 76.

In the above-mentioned embodiment, although the semiconductor chip 71 is formed as the vertical-type power MOS- FET chip, it may be a diode chip featuring an anode electrode layer and a cathode electrode layer formed on the opposite principal faces thereof.

Finally, it will be understood by those skilled in the art that the foregoing description is of preferred embodiments of the devices and methods, and that various changes and modifications may be made to the present invention without departing from the spirit and scope thereof.

The invention claimed is:

1. A semiconductor device comprising:
    a semiconductor chip featuring first and second principal faces opposite to each other, and side faces extending therebetween;
    a first electrode layer formed on the first principal face of said semiconductor chip;
    a second electrode layer formed on the second principal face of said semiconductor chip;
    a first metal electrode terminal electrically adhered to said first electrode layer so that a part of said first metal electrode terminal extends beyond one of said side faces of said semiconductor chip so as to space said semiconductor chip from a mounting surface; and
    a second metal electrode terminal electrically adhered to said second electrode layer so that a part of said second metal electrode terminal extends beyond the one of said side faces of said semiconductor chip so as to space said semiconductor chip from said mounting surface,
    wherein the parts of said first and second metal electrode terminals have respective soldering faces which are perpendicular to the first and second principal faces of said semiconductor chip, and which are coplanar with each other.

2. The semiconductor device as set forth in claim 1, wherein said first and second metal electrode terminals are arranged so that said semiconductor device itself can stand when being placed on a plane of said mounting surface so that said soldering faces are in contact with said plane.

3. The semiconductor device as set forth in claim 1, wherein each of said first and second electrode terminals is provided with a finned heat-radiator adhered to an outer face of the corresponding electrode terminal which is in parallel with the principal faces of said semiconductor device.

4. The semiconductor device as set forth in claim 1, further comprising:
    a third electrode layer formed on the first principal face of said semiconductor chip; and
    a third metal electrode terminal electrically adhered to said third electrode layer so that a part of said third metal electrode terminal is protruded out of the one of said side faces of said semiconductor chip,
    wherein the part of said third metal electrode terminal has a soldering face which is perpendicular to the first and second principal faces of said semiconductor chip, and which is coplanar with the soldering faces of said first and second metal electrode terminals.

5. The semiconductor device as set forth in claim 4, wherein said semiconductor chip is formed as a vertical-type power metal oxide semiconductor field effect transistor chip.

6. The semiconductor device as set forth in claim 5, wherein said first, second and third electrode layers are defined as respective source, drain and gate electrode layers.

7. The semiconductor device as set forth in claim 1, wherein the electrical adhesion of said first and second metal electrode terminals to said respective first and second electrode layers is carried out by electrically conductive adhesive layers.

8. The semiconductor device as set forth in claim 1, wherein each of said first and second metal electrode terminals is defined as a L-shaped cross sectional metal electrode terminal which has a leg portion, and a foot portion perpendicularly and integrally extending from an end of the leg portion, with each of said soldering faces being defined as a bottom face of the corresponding foot portion.

9. The semiconductor device as set forth in claim 1, wherein each of said first and second metal electrode terminals is defined as an elongated generally-trapezoid cross-sectional metal electrode terminal, with each of said soldering faces being defined as a bottom face of the corresponding elongated generally-trapezoid cross-sectional metal electrode terminal.

10. A semiconductor device comprising:
    a semiconductor chip having first and second principal faces opposite to each other, and side faces extending therebetween;
    a first electrode layer formed on the first principal face of said semiconductor chip;
    a second electrode layer formed on the second principal face of said semiconductor chip;
    a first metal electrode terminal having a first portion electrically adhered to said first electrode layer and having a second portion connected to a mounting surface; and
    a second metal electrode terminal having a first portion electrically adhered to said second electrode layer and having a second portion connected to said mounting surface, said first and second metal electrode terminals each including a part that extends beyond one of said side faces of said semiconductor chip so that said semiconductor chip is spaced apart from said mounting surface,
    wherein the second portion of each of said first and second metal electrode terminals have respective soldering faces which are perpendicular to the first and second principal faces of said semiconductor chip, and which are coplanar with each other.

11. The semiconductor device as set forth in claim 10, wherein said mounting surface is a surface of a circuit board.

* * * * *